United States Patent [19]

Ngo et al.

[11] Patent Number: 6,033,584
[45] Date of Patent: Mar. 7, 2000

[54] PROCESS FOR REDUCING COPPER OXIDE DURING INTEGRATED CIRCUIT FABRICATION

[75] Inventors: Minh Van Ngo, Union City; Guarionex Morales, Santa Clara; Takeshi Nogami, Sunnyvale, all of Calif.

[73] Assignee: Advanced Micro Devices, Inc., Sunnyvale, Calif.

[21] Appl. No.: 08/995,499

[22] Filed: Dec. 22, 1997

[51] Int. Cl.[7] .................................................... H01L 21/00
[52] U.S. Cl. ............................. 216/67; 438/694; 438/695; 438/703; 438/710; 438/720; 438/722; 438/759
[58] Field of Search ............................... 216/67; 438/694, 438/695, 703, 710, 720, 722, 759

[56] References Cited

U.S. PATENT DOCUMENTS

| | | | |
|---|---|---|---|
| 5,225,034 | 7/1993 | Yu et al. | 438/693 |
| 5,354,490 | 10/1994 | Yu et al. | 252/79.1 |
| 5,549,786 | 8/1996 | Jones et al. | 156/662.1 |
| 5,840,629 | 11/1998 | Carpio | 428/692 |
| 5,897,379 | 4/1999 | Ulrich et al. | 438/754 |

OTHER PUBLICATIONS

D.R. Evans, Y. Ono, J.F. Wang, A.R. Sethuraman, and L. M. Cook, Yield and Defect Characterization of Copper CMP Metallization, Aug. 13, 1999, pp. 1–4.

The Associated Press, IBM Unveils Copper–based Chip, Sep. 21, 1997, pp. 1–2.

Semiconductor Equipment: Source, Technical Showcase, Research Center Chooses $MB^2$ for CVD Copper Interconnect, Winter 1997 (No Month).

Andrew Brooks, IBM Disclosure Fast Copper–Based Chip (Sep. 22), 1997, pp. 1–2.

Jiun–Fang Wang, Anantha R. Sethurarnan, Lee M. Cook, David R. Evans, and Victoria L. Shannon, Surface: Technology Review, Chemical Mechanical Polishing of Copper Metallized Multilevel Interconnect Devices, Fall 1994, pp. 1–4 (No Month).

*Primary Examiner*—Anthony Green
*Attorney, Agent, or Firm*—Brinks Hofer Gilson & Lione

[57] ABSTRACT

A method of integrated circuit fabrication creating copper interconnect structures wherein the formation of copper oxide is reduced or eliminated by etching away the copper oxide performing an $H_2$ plasma treatment in a plasma enhanced chemical vapor deposition chamber.

18 Claims, 8 Drawing Sheets

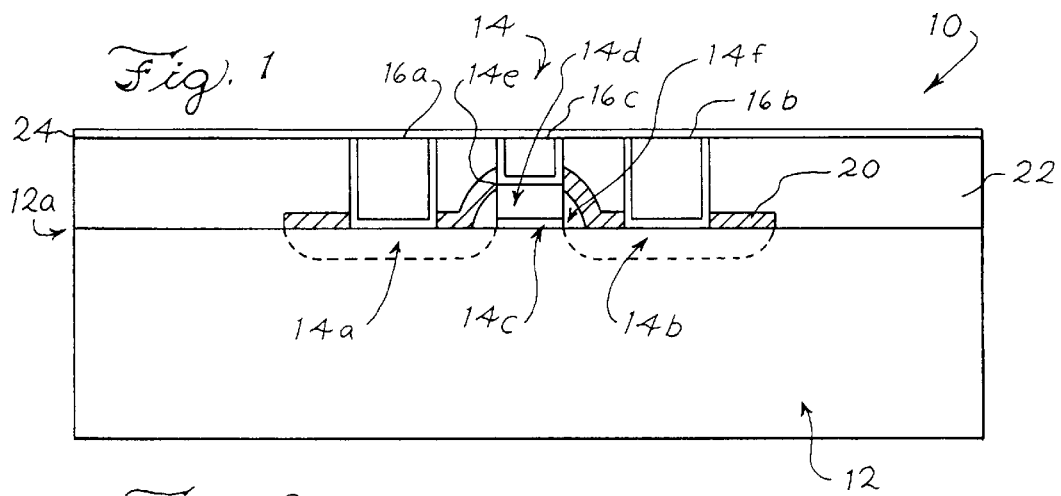
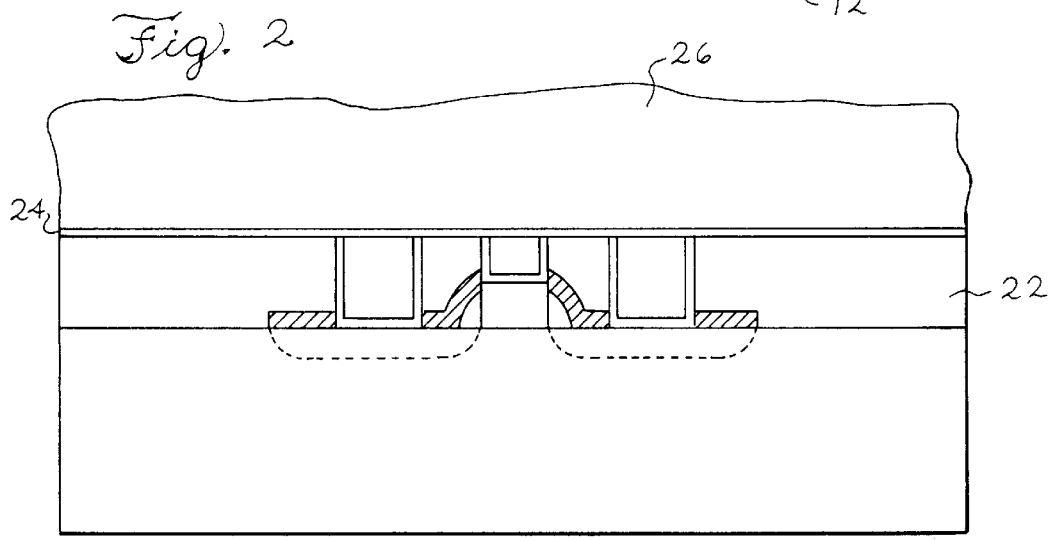
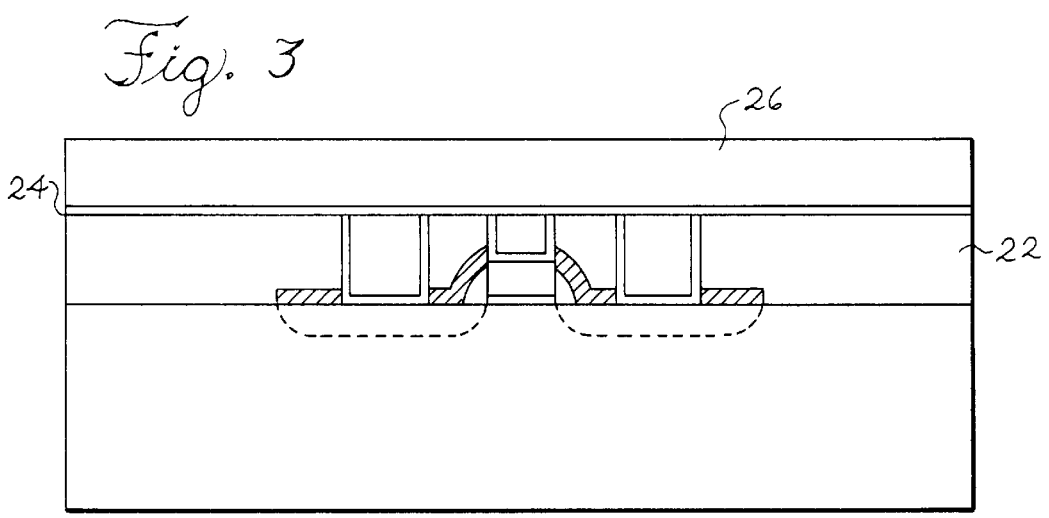

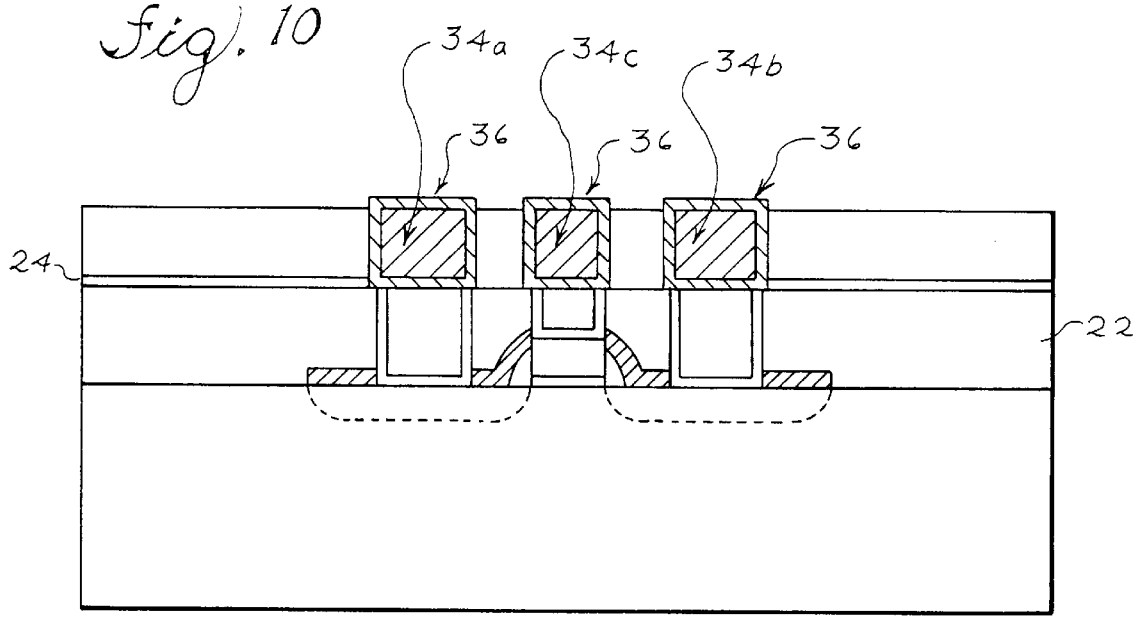
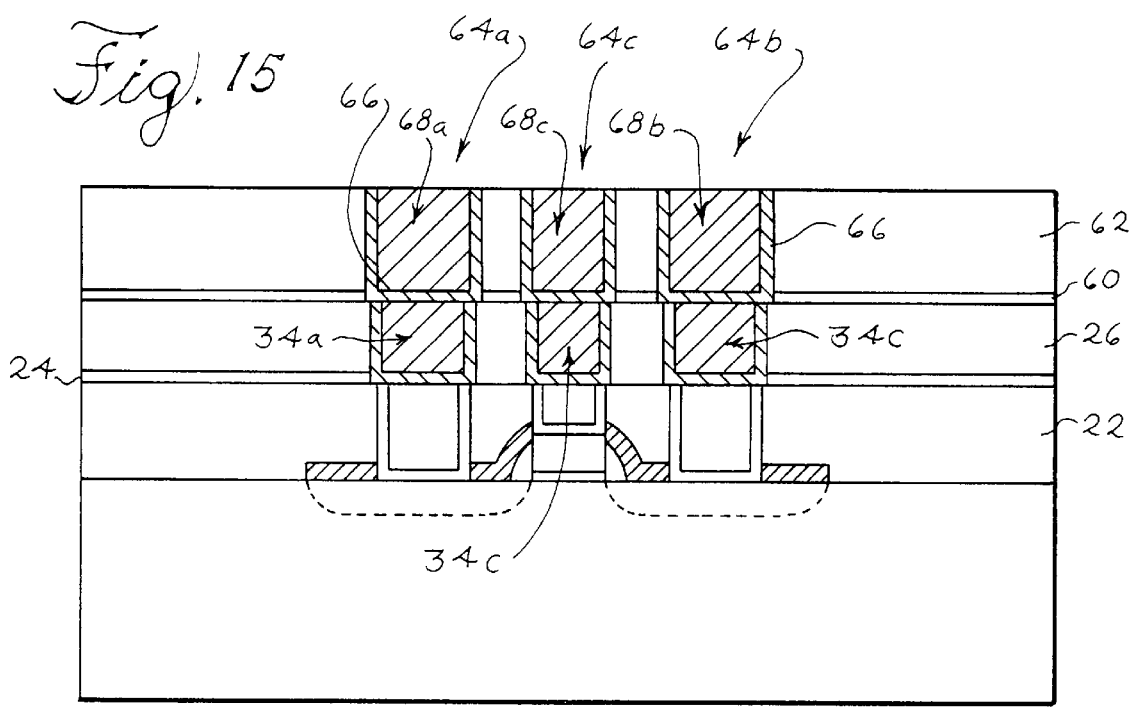

PROCESS FOR REDUCING COPPER OXIDE DURING INTEGRATED CIRCUIT FABRICATION

BACKGROUND OF THE INVENTION

FIELD OF THE INVENTION

This invention relates to integrated circuit fabrication and more particularly to a process for reducing copper oxide by performing an $H_2$ plasma treatment in a plasma enhanced chemical vapor deposition.

DESCRIPTION OF RELEVANT ART

Metal films are utilized in semiconductor technology to wire together various components formed on a semiconductor wafer. These wires are called interconnects. Metal in semiconductor processing can also be used to function as gate electrodes in MOS structures, and as electrodes in thin film capacitors. Elemental aluminum and its alloys have been the traditional metals utilized. Advantages of aluminum include its low resistivity, superior adhesion to $S_iO_2$, ease of patterning, and high purity.

Aluminum, however, does have disadvantages for certain applications. First, the electrical contact of aluminum with silicon while adequate for large scale integration (LSI) level technology, has reached its limit in the very large scale integration (VLSI) area. Another disadvantage associated with aluminum is electromigration. This is a phenomenon that occurs in aluminum metal leads while the circuit is in operation. Electromigration is caused by the diffusion of the aluminum in the electric field set up in the lead while the circuit is in operation. It is also enhanced by thermal gradients that arise in the lead from the heat generated by flowing current. The metal thins and eventually separates completely causing an opening in the circuit. Electromigration occurs over time and may not show up until a device has had many hours of operation. This problem is presently overcome by designing wide overlap regions at contacts using a constant film thickness, or alloying aluminum with other materials such as copper or silicon.

Electromigration becomes more worrisome as the level of integration increases. The higher number of circuit components in VLSI, ultra large scale integration (ULSI) and beyond creates greater current flow thereby generating more heat. Accordingly, as integrated circuit patterning schemes continue to miniaturize into the submicron dimensions, aluminum-based metallurgies will become increasingly marginal for handling the increased circuit speed and current density requirements.

Recently there has been interest in using copper instead of aluminum as a conductor in semiconductor chips because copper has a relatively low bulk resistivity of about 1.67 $\mu\Omega$- cm compared to aluminum which is about 2.65 $\mu\Omega$- cm. In addition, copper has better electro-migration properties. Moreover, using copper to form the interconnects increases the speed of operation of a chip and thus allows the chip to handle more information.

However, a primary problem with integrating copper metal into multilevel metallization systems is the difficulty of patterning the metal using etching techniques. For devices of submicron minimum feature size, wet etch techniques for copper patterning have not been acceptable due to a) liquid surface tension, b) isotropic etch profile, and c) difficulty in over-etch control. Thus, chemical-mechanical polishing (CMP) appears to be the most practical and cost effective method of patterning copper. A drawback of patterning the copper by polishing is the formation of a layer of copper oxide on the exposed copper surface. In order to improve via/contact resistance and adhesion of an additional metallization layer this copper oxide layer needs to be substantially reduced or eliminated before an additional metallization layer is disposed over the copper layer.

It is thus desirable to provide a process for reducing or eliminating copper oxide during the formation of a multilevel copper interconnect structure. In addition, it is also desirable to provide a process for reducing the possibility of oxide reforming on an exposed copper surface before another metallization layer is formed over the copper interconnect structure.

SUMMARY OF THE INVENTION

According to an aspect of the invention, there is provided a method for reducing the amount of copper oxide formed over a surface of copper on a semiconductor wafer. The method includes the steps of:

placing the semiconductor wafer in a gap between a pair of electrodes arranged within a reaction chamber;

establishing a flow of $H_2$ gas through said reaction chamber;

adjusting the pressure within said reaction chamber; and applying RF power between the pair of electrodes for selectively etching said copper oxide from said surface of copper on said semiconductor wafer.

BRIEF DESCRIPTION OF THE DRAWINGS

FIGS. 1 to 10 and 15 are simplified sectional views illustrating steps of a process for fabricating a semiconductor device according to the present invention.

DETAILED DESCRIPTION OF THE PRESENTLY PREFERRED EMBODIMENTS

Figure 4:
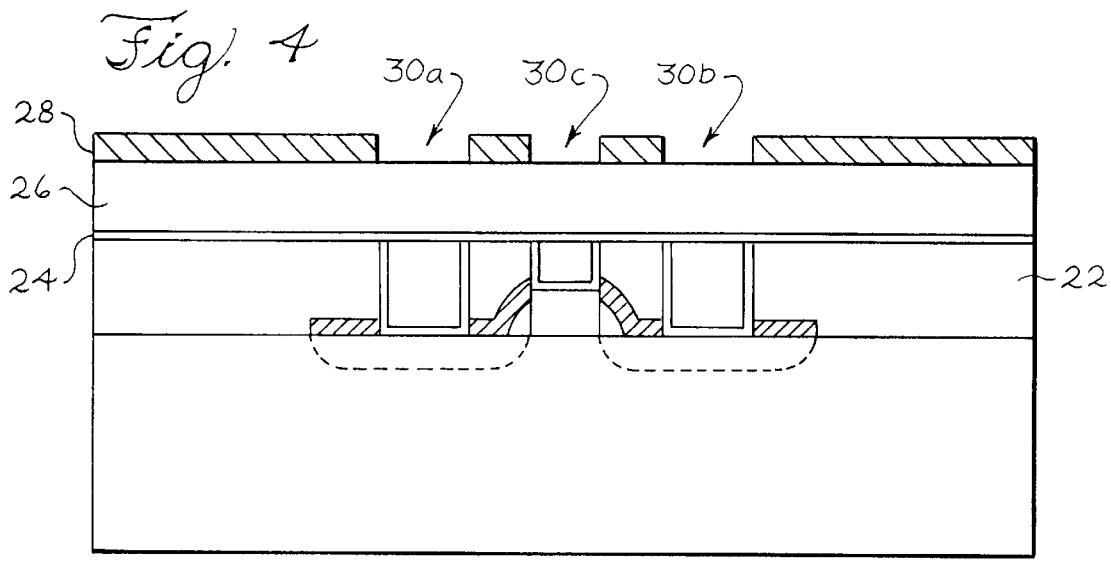

In the drawings, depicted elements are not necessarily drawn to scale and alike and similar elements may be designated by the same reference numerals through several views.

The present inventors have discovered that when copper is used for a multilevel interconnect structure of a semiconductor device and the copper is patterned using CMP, a layer of copper oxide forms on a polished surface of copper. This oxide, if not removed before another metal layer is formed over the copper, creates an increase in contact resistance and creates adhesion problems which are not desirable. The present invention overcomes these problems by reducing the amount of copper oxide present and thereby improving contact resistance and also improving adhesion between the copper layer and the copper diffusion layer silicon nitride.

FIGS. 1 to 10 and 15 are simplified sectional diagrams illustrating a process for fabricating a portion of a semiconductor device according to the present invention. The detailed configuration of the device is not the particular subject matter of the invention, and only those elements which are necessary for understanding the invention will be described and illustrated.

As shown in FIG. 1, the semiconductor device or wafer 10 includes a silicon substrate 12. For illustration purposes only a transistor 14 is shown formed on a surface 12a of the substrate 12. Of course many other components can be formed on the substrate 12. The transistor 14 includes a source 14a, a drain 14b, a gate oxide layer 14c, polygate 14d overlying the gate oxide layer 14c, titanium silicide ($TiSi_2$) 14e and spacer oxide 14f. Contacts 16a, 16b and 16c are formed over the source 14a, drain 14b and gate 14d of the transistor 14. The contacts 16a, 16b and 16c are preferably formed of titanium nitride as a glue layer and tungsten. Insulator layer 20 is a etch stop layer, preferably formed of silicon oxynitride (SiON) and a layer 22 preferably of tetraethylorthosilicate (TEOS) glass, is formed over the surface 12a and transistor 14 of the substrate 12 and isolates the contacts 16a, 16b and 16c from one another. A very thin copper diffusion layer 24 is formed over the insulator layer 22. Preferably the copper diffusion layer 24 is formed of silicon nitride (SiN) and has a thickness of about 500 Å. The formation of the contacts 16a, 16b and 16c, etch stop layer 20, insulator layer 22 and copper diffusion layer 24 are well known to those of ordinary skill in the art and need not be described in further detail.

The construction and operation of the components are not the particular subject matter of the invention and thus will not be described. Furthermore, the reference numerals designating the individual elements of the transistor 14 will be omitted in FIGS. 2 to 10 and 15 except as required for understanding the invention to avoid cluttering of the drawings.

The remaining steps result in the formation of a multilevel copper interconnect structure for the transistor 14.

Figure 5:
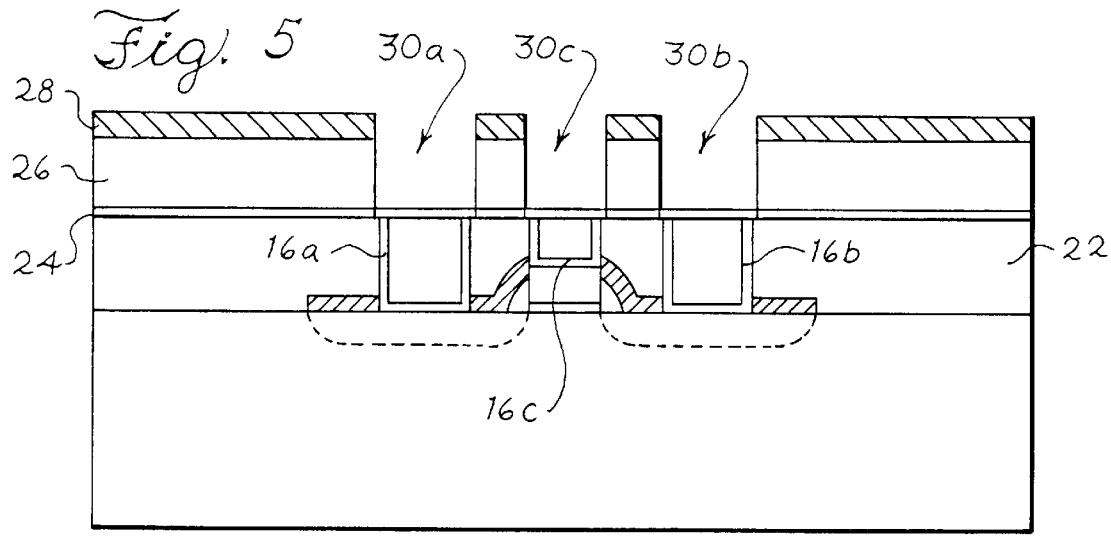
Figure 6:
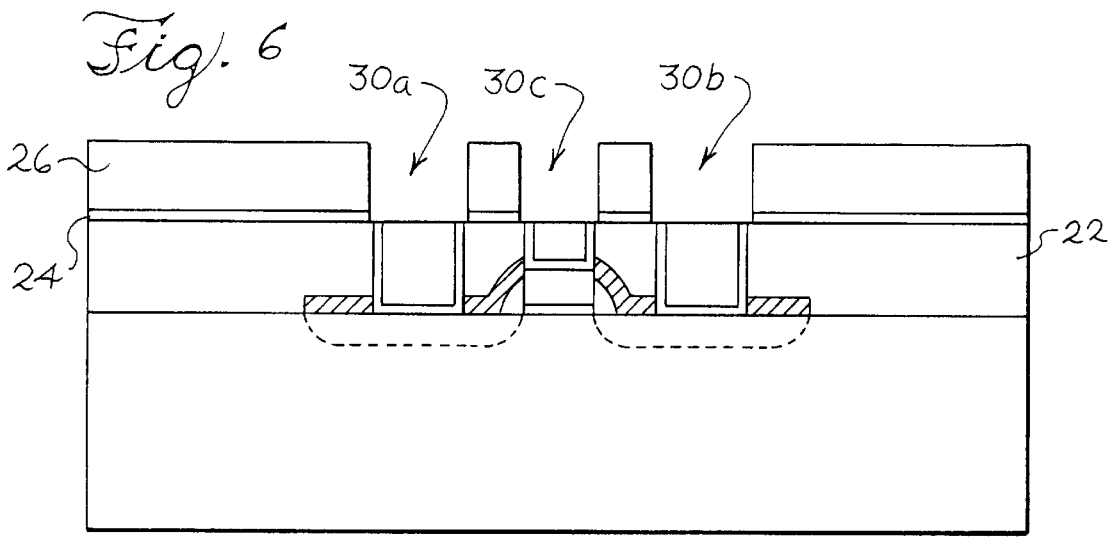

A layer of silicon oxide ($SiO_2$) 26 is formed over diffusion layer 24 and contacts 16a, 16b and 16c as shown in FIG. 2. In a preferred embodiment the layer of $SiO_2$ 26 is formed using Plasma Enhanced Chemical Vapor Deposition (PECVD) as is well known to those of ordinary skill in the art. Next the layer of $SiO_2$ 26 is planarized by chemical-mechanical polishing as shown in FIG. 3. In FIG. 4 a layer of photoresist 28 is formed on the $SiO_2$ layer 26, and patterned using photolithography so that holes 30a, 30b and 30c are formed above the contacts 16a, 16b and 16c respectively. In FIG. 5 the holes are etched through the $SiO_2$ layer 26 and diffusion layer 24 down to the tungsten plugs 16a, 16b and 16c preferably using Reactive Ion Etching (RIE). The photoresist layer 28 is then removed as shown in FIG. 6.

Figure 7:
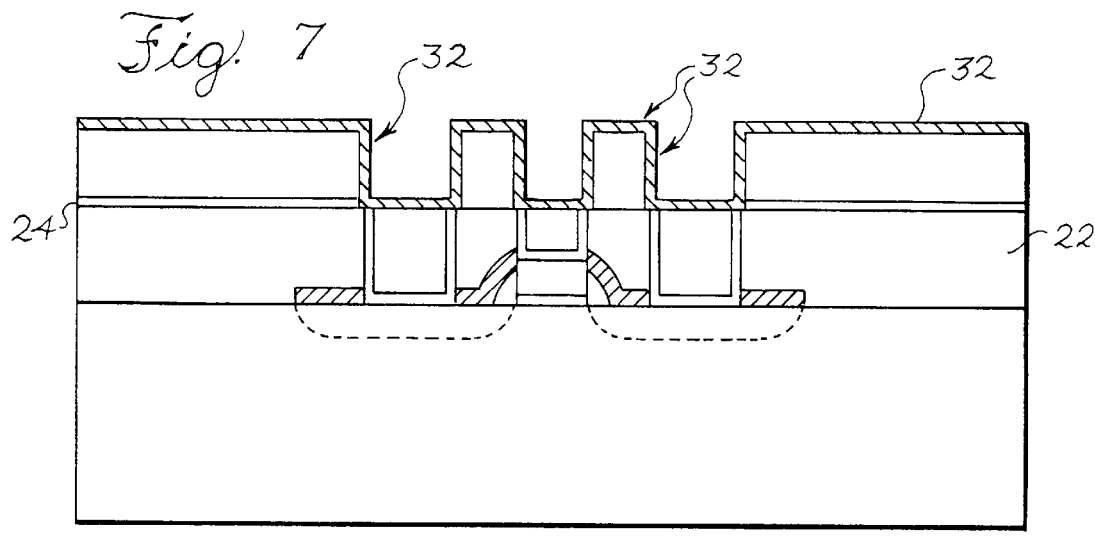

Next a very thin barrier layer 32 preferably of tantalum is deposited in the holes 30a, 30b and 30c as well as other areas as shown in FIG. 7. The layer 32 coats the sides and bottom of the holes as well as the top surface of the wafer as shown. In a preferred embodiment the layer 32 has a thickness of about 200 Å and is deposited using Physical Vapor deposition (PVD) as is well known to those of ordinary skill in the art. The layer of tantalum 32 acts as a barrier layer for the copper which will be deposited next.

Figure 8:
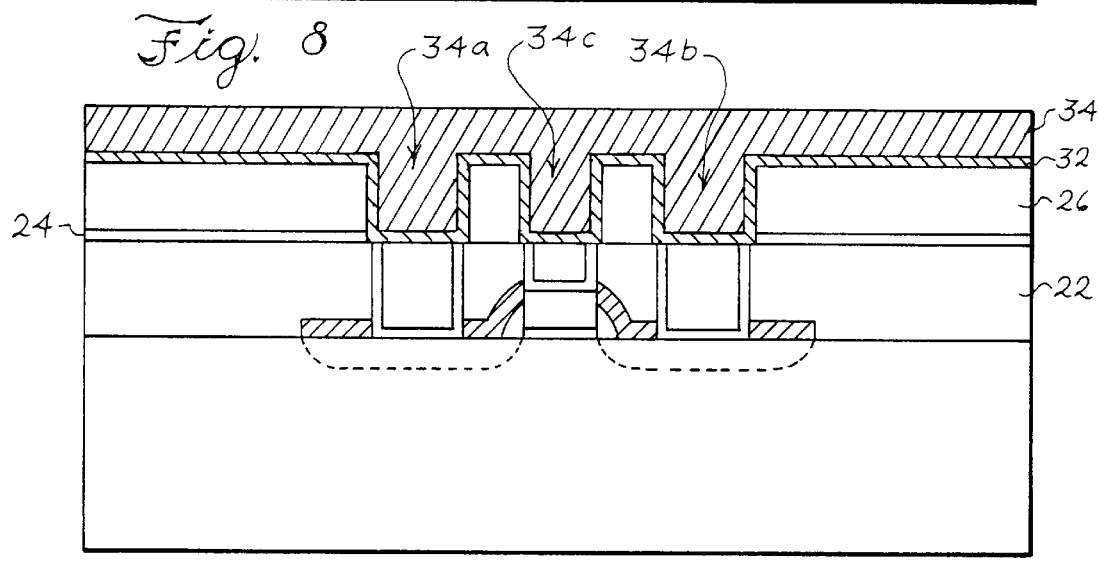

Next a layer of copper 34 is deposited over the structure of FIG. 7 as shown in FIG. 8. The copper 34 fills the holes 30a, 30b and 30c as indicated at 34a, 34b and 34c and ohmically contacts the tungsten plugs 16a, 16b and 16c respectively. In a preferred embodiment the copper 34 is deposited by copper sputtering and followed by copper electroplating.

Figure 9:
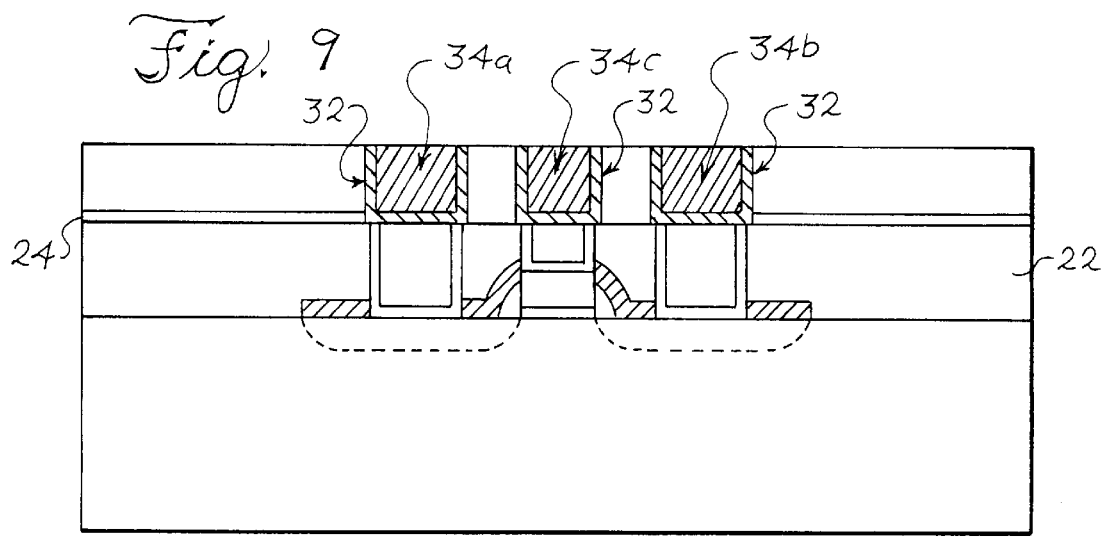

The copper is then patterned by chemical-mechanical polishing (CMP) to remove the copper 34 and the top surface of tantalum 32 from the surface of the $SiO_2$ layer 26 as shown in FIG. 9. This results in independent local interconnects 34a, 34b and 34c which are formed of copper inlaid in the $SiO_2$ layer 26. It has been found that after the copper has been patterned using CMP, a layer of copper oxide 36 forms on over the copper as shown in FIG. 10. The copper oxide 36 needs to be substantially reduced or removed before an additional interconnect layer can be deposited on the exposed copper surface in order to improve adhesion and contact resistance. In a preferred embodiment, the copper oxide 36 is removed using $H_2$ plasma treatment in a plasma enhanced chemical vapor deposition (PECVD) chamber according to the present invention. PECVD improves on basic chemical vapor deposition (CVD) by creating a glow discharge or plasma in a reaction chamber which etches away the copper oxide 36.

Figure 11:
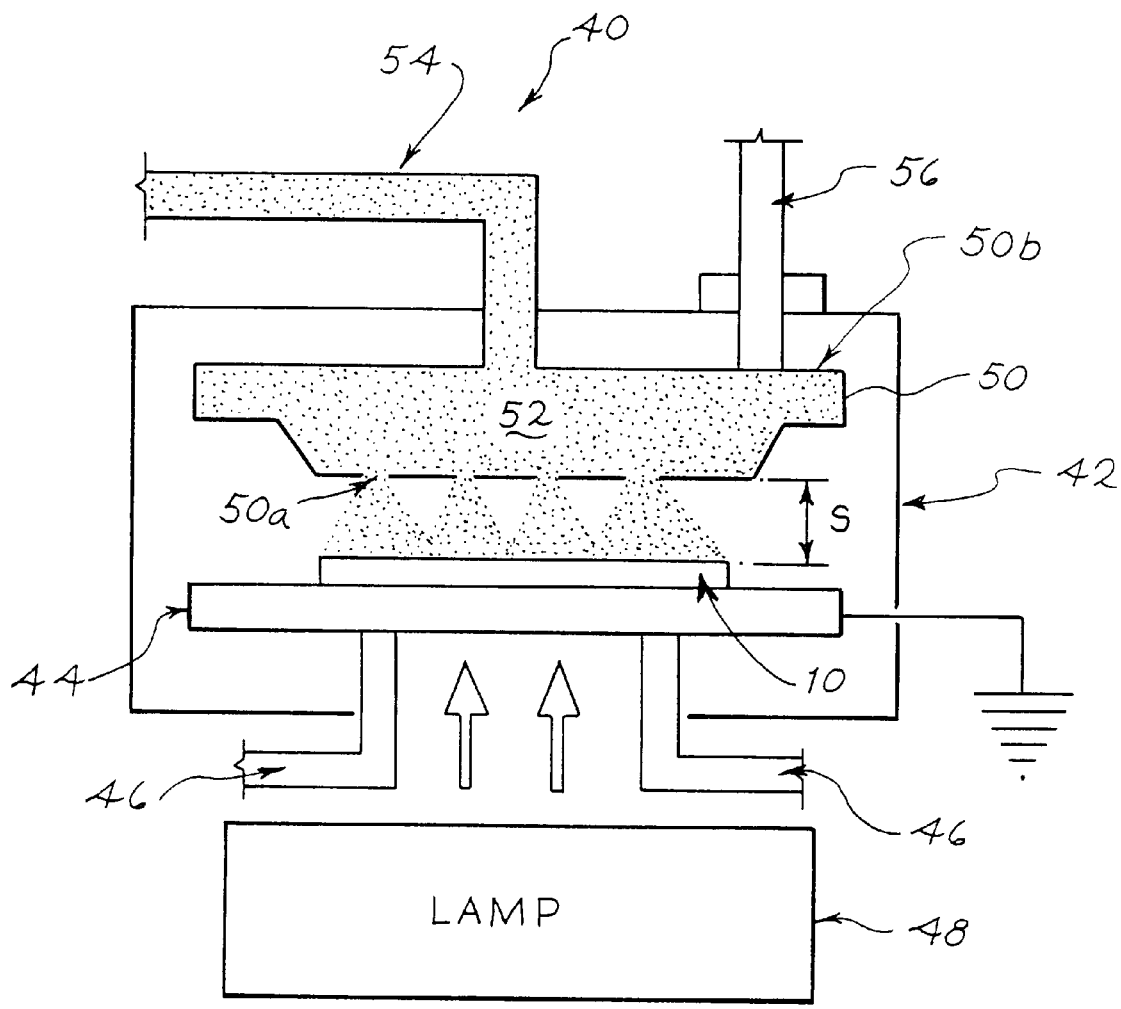
FIG. 11 is a simplified diagram illustrating a Plasma Enhanced Chemical Vapor Deposition (PECVD) apparatus for practicing the present invention.

A PECVD reaction chamber 40 is illustrated in FIG. 11 and includes a container 42. Such a chamber 40 is commercially available from Applied Materials Corporation of Santa Clara, CA as model AMT5000. An electrically grounded susceptor 44 is suspended in the container 42. The silicon wafer 10 shown in FIG. 10 is supported on the susceptor 44. Lift pins 46 are provided for positioning the wafer 10 with respect to a gas discharge nozzle which is known in the art as a shower head 50. In a preferred embodiment the top surface of the wafer 10 is spaced a distance S from the shower head 50 where S is in the range of about 700 millimeters to about 750 millimeters and more preferably is a distance of 700 millimeters. The shower head 50 and the susceptor 44 act as a pair of electrodes.

A second copper interconnect layer will now be formed on the device shown in FIG. 10. As was previously described with reference to FIGS. 2–10, a second copper diffusion layer 60 is formed over the top surface of water 10 (see FIG. 15). Then a second layer of silicon oxide ($SiO_2$) 62 is deposited over the second barrier layer 60. The $SiO_2$ layer 62 is patterned and etched as previously described to create holes 64a, 64b and 64c over the copper regions 34a, 34b and 34c respectively in the underlying layer. The same steps used to create the first interconnect layer are used to create the second interconnect layer, i.e., the copper regions 34a, 34b and 34c have copper oxide 36 (see FIG. 10) that need to be reduced or removed before a barrier layer preferably of tantalum 66 is deposited.

In order to reduce or remove the copper oxide 36 the wafer 10 is placed on the susceptor 44 of chamber 40 (FIG. 11) and the chamber 40 is evacuated by creating a vacuum in container 42 using well known techniques. The wafer 10 is then heated to a temperature of approximately 290° C. to 340° C., preferably 315° C., by a lamp 48. After the wafer 10 has been placed on the susceptor 44 and heated, the container 42 is pressurized preferably to a pressure within the range of about 0.4 Torr to about 1.2 Torr and more preferably to a pressure of about 0.8 Torr.

A gas mixture 52 which is used to reduce the amount of copper oxide 36 is fed into the shower head 50 through an inlet conduit 54 and discharged downwardly toward the wafer 10 through orifices 50a. The gas 52 preferably includes hydrogen ($H_2$), and nitrogen ($N_2$). In a preferred embodiment the flow rate of $H_2$ is approximately 300 to 700 sccm, preferably 500 sccm, and the flow rate of $N_2$ is approximately 50 to 200 sccm, preferably 100 sccm.

Radio Frequency (RF) power is applied to the shower head 50 through a power lead 56. A blocker plate 50b is provided at the upper end of the shower head 50 to prevent gas from escaping upwardly. The RF power applied to the shower head 50 creates an alternating electrical field between the shower head 50 and the grounded susceptor 44 which forms a glow or plasma discharge in the gas 52 therebetween. The shower head 50 and the grounded susceptor 44 thus act as electrodes. The plasma discharge etches away the copper oxide 36 so that it can be substantially reduced or eliminated. An RF power of approximately 150 to 390 watts, preferably 225 watts, is used. The wafer 10 is then removed from the chamber 40 so that the additional interconnect layer can be formed.

Figure 12:
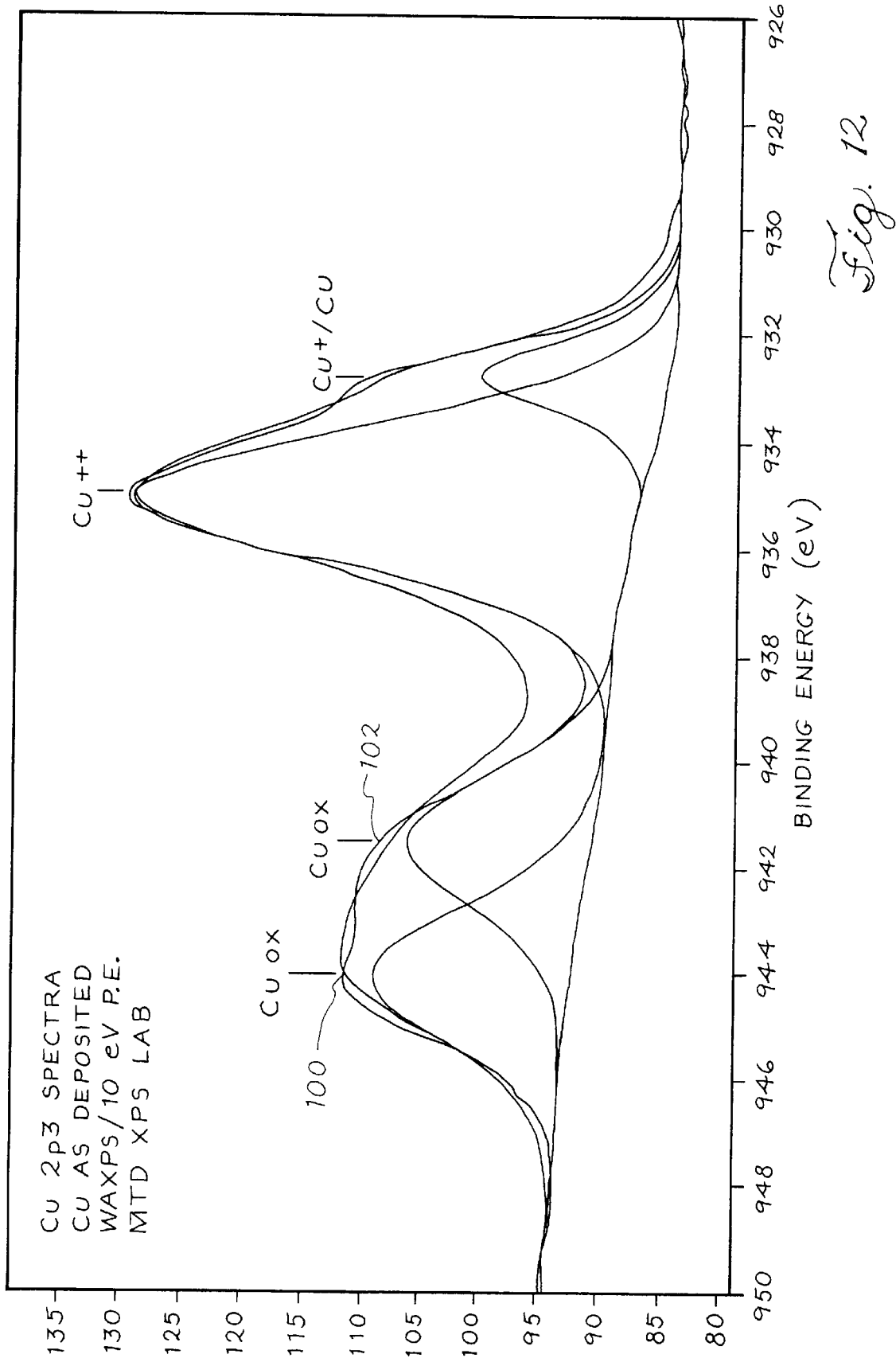
FIGS. 12–14 are graphs illustrating the reduction of copper oxide using the process according to the present invention.
Figure 13:
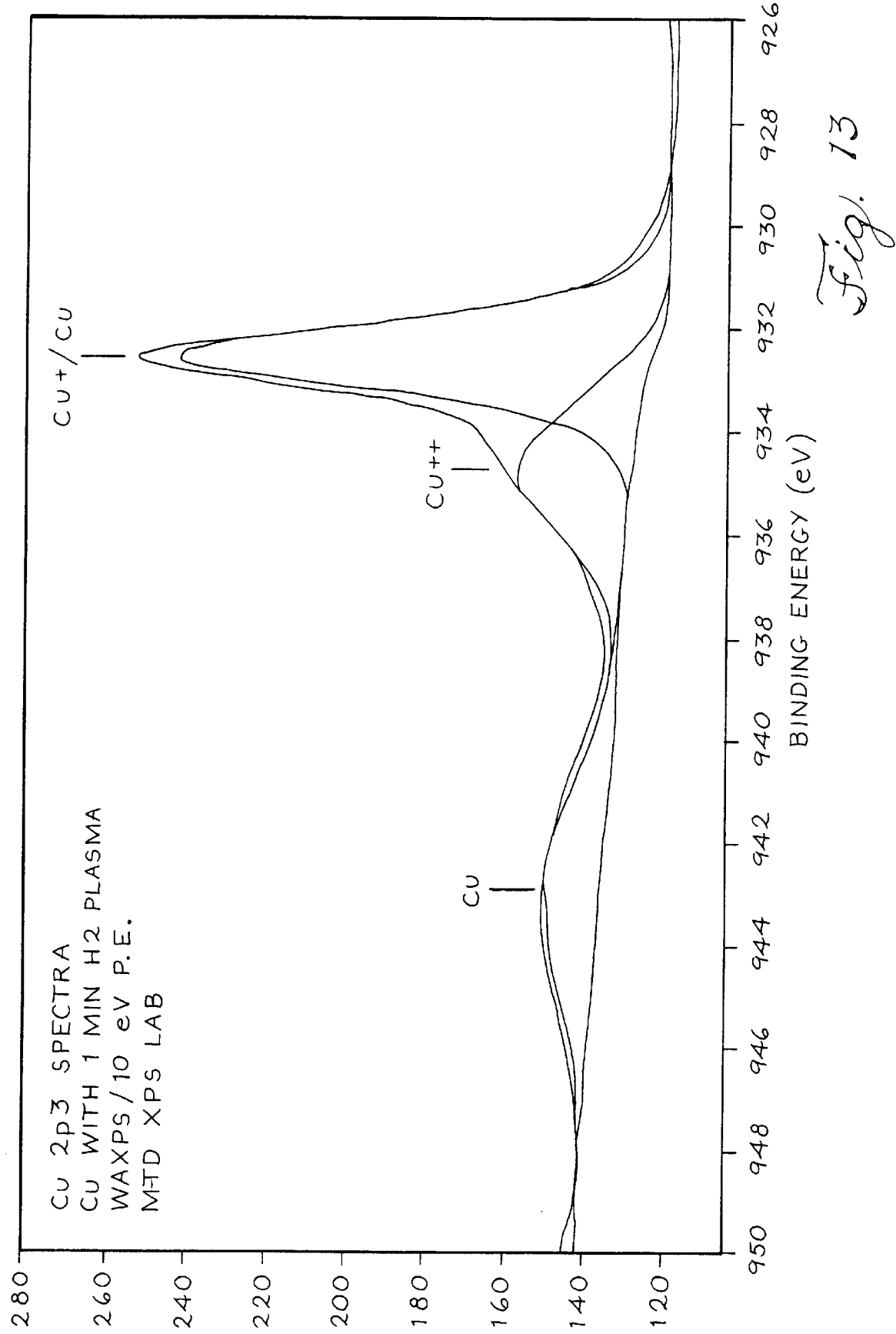
Figure 14:
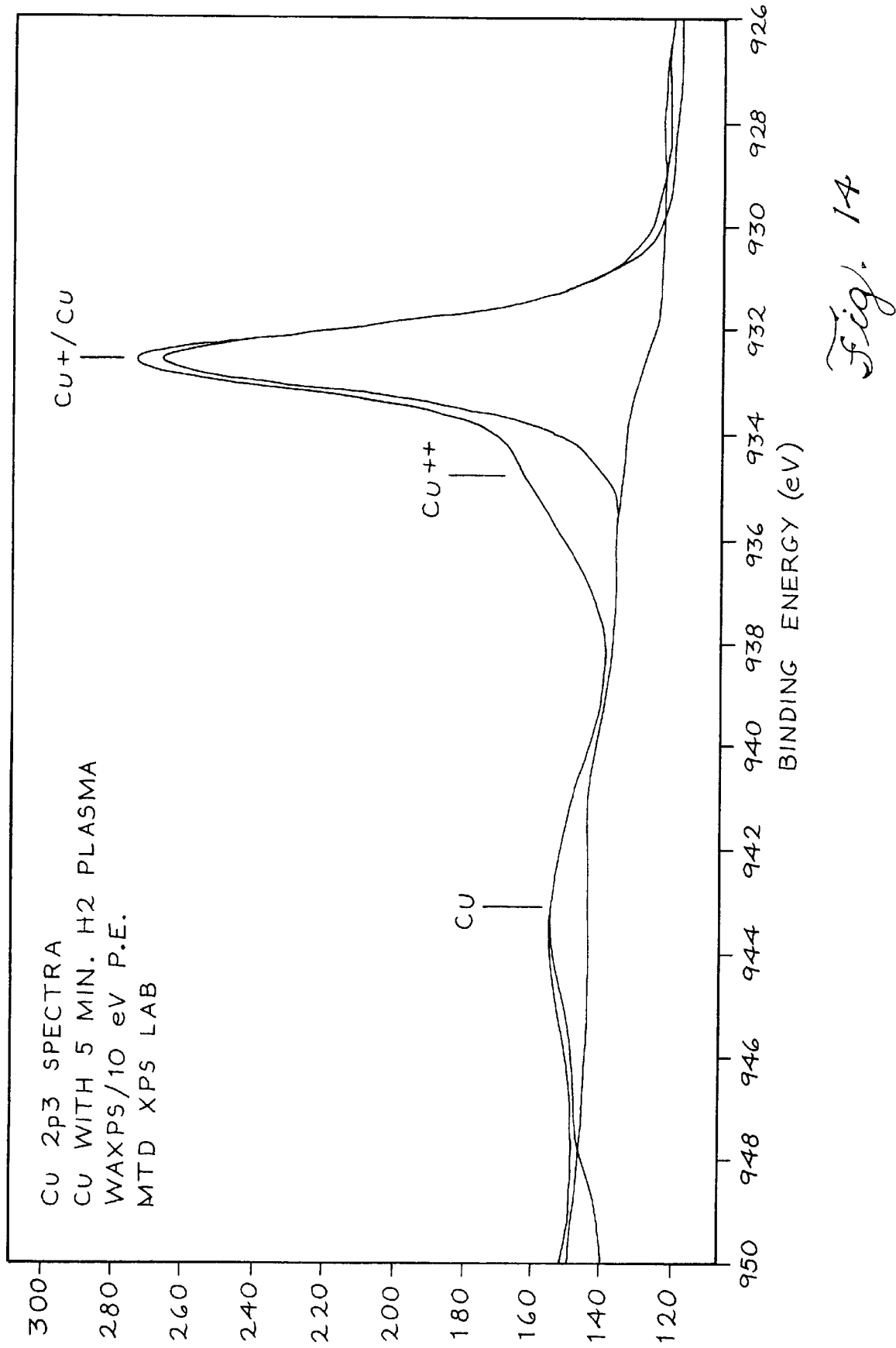

FIG. 12 is a graph showing the copper oxide formation. At points 100 and 102 is shown the amount of copper oxide formed on exposed copper. FIG. 13 is a graph showing the reduction in copper oxide for a wafer under 1 minute of $H_2$ plasma treatment according to the present invention. FIG. 14 is a graph showing the reduction in copper oxide for a wafer under 5 minutes of the plasma treatment according to the present invention. Thus in a preferred embodiment the wafer undergoes $H_2$ plasma treatment according to the present invention for a time period ranging from about 1 minute to about 5 minutes, preferably about 2 minutes.

Referring back to FIG. 15, the barrier layer 66 is again used to line holes 64a, 64b and 64c. Then copper 68 is again deposited to fill holes 64a, 64b and 64c. The copper is patterned by CMP to produce the structure shown in FIG. 15. The interconnects formed of copper enable the contacts of the source 14a and drain 14b of the transistor 14 to be electrically accessed from the upper surface of the structure. While only two copper interconnect layers have been illustrated, more layers can be formed in the manner described. It is important to remove the copper oxide formed on a layer before another metal layer is formed so that adhesion between the layers and the resistance of the interconnect structure is improved.

It will be appreciated that the drawings have not been drawn to scale but rather have been exaggerated for illustration purposes. By forming multiple layers or levels of closely spaced interconnects, an increase in the density of devices formed on semiconductor wafers is possible. Using copper provides increased speed of operation of the devices.

In another preferred embodiment instead of forming barrier layers 32 and 66 from tantalum, tungsten nitride ($WN_x$) may be used. If tungsten nitride is used then the barrier layer 66 formed in the second interconnect layer shown in FIG. 15 can be deposited while the wafer 10 is still in the same chamber 40 illustrated in FIG. 11 after the copper oxide has been reduced or eliminated. More particularly, after the copper oxide has been etched away, the tungsten nitride layer can be deposited by using the following gases: tungsten hexafluoride ($WF_6$); nitrogen trifluoride ($NF_3$) and hydrogen ($H_2$). This has the advantage of reducing the likelihood that the copper surface will reoxidize. In addition, because the same chamber 40 is used the production cycle is reduced as well as the number of defects.

Finally, if the wafer 10 is heated in the chamber 40 during $H_2$ plasma treatment according to the present invention to a low temperature of no more than about 315° C., the process can be integrated with a low k dielectric material such as Benzocyclobutene (BCB).

While the invention is susceptible to various modifications and alternative forms, specific embodiments thereof are shown by way of example in the drawings and described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

What is claimed is:

1. A method for reducing the amount of copper oxide formed over a surface of copper on a semiconductor wafer, the method comprising the steps of:

placing the semiconductor wafer in a gap between a pair of electrodes arranged within a reaction chamber;

establishing a flow of $H_2$ gas through said reaction chamber;

adjusting the pressure within said reaction chamber to a pressure within the range of about 0.4 Torr to about 1.2 Torr; and applying RF power between the pair of electrodes for selectively etching said copper oxide from said surface of copper on said semiconductor wafer.

2. The method according to claim 1 wherein the step of adjusting the pressure with said reaction chamber comprises increasing the pressure with the chamber to a pressure of about 0.8 Torr.

3. The method according to clam 1 further comprising the step of adjusting the gap between the pair of electrodes to about 700 millimeters wherein said gap adjusting step precedes applying RF power between the pair or electrodes.

4. The method according to claim 1 wherein the flow of $H_2$ gas is established in the range of about 300 sccm to about 700 sccm.

5. The method according to claim 1 wherein the flow of $H_2$ gas is established at substantially 500 sccm.

6. The method according to claim 1 further comprising the step of establishing a flow of $N_2$ gas at the same time the step of establishing a flow of $H_2$ gas occurs.

7. The method according to claim 6 wherein the flow of $N_2$ gas established during said step of establishing a flow of $N_2$ gas is in the range of about 50 sccm to about 200 sccm.

8. The method according to claim 6 wherein the flow of $N_2$ gas established during said step of establishing a flow of $N_2$ gas is about 100 sccm.

9. The method according to claim 1 wherein the amount of RF power applied between the pair of electrodes during the step of applying RF power is in the range of about 150 watts to about 390 watts.

10. The method according to claim 1 wherein the amount of RF power applied between the pair of electrodes during the step of applying RF power is about 225 watts.

11. The method according to claim 1 wherein the step of applying RF power is carried out for a time period ranging from about 1 minute to about 5 minutes.

12. The method according to claim 1 wherein the step of applying RF power is carried out for a time period of about 2 minutes.

13. The method according to claim 1 further comprising the step of heating the semiconductor wafer prior to the step of establishing a flow of $H_2$ gas to a temperature within a range of about 290° C. to about 340° C.

14. The method according to claim 1 further comprising the step of heating the semiconductor wafer prior to the step of establishing a flow of $H_2$ gas to a temperature of about 315° C.

15. The method according to claim 1 further comprising the step of depositing a layer of tungsten nitride over the copper surface after etching the copper oxide from the copper surface.

16. The method according to claim 1 further comprising the step of depositing a layer of tantalum over the copper surface after etching the copper oxide from the copper surface.

17. The method according to claim 1 further comprising the steps of heating the semiconductor wafer prior to the step of establishing a flow of $H_2$ gas to a temperature of about 315° C. and after the step of applying RF power has been completed establish a flow of a low k dielectric material.

18. The method according to claim 17 wherein the low k dielectric material is benzocyclobutene (BCB).

* * * * *